United States Patent [19]

O'Hare

[11] Patent Number: 4,737,711
[45] Date of Patent: Apr. 12, 1988

[54] NUCLEAR MAGNETIC RESONANCE SEPARATION

[76] Inventor: Louis R. O'Hare, 1066A County Rd. 335, Pagosa Springs, Colo. 81147

[21] Appl. No.: 46,570

[22] Filed: May 6, 1987

[51] Int. Cl.$^4$ ............................................. G01R 33/20
[52] U.S. Cl. ..................................... 324/300; 324/322
[58] Field of Search .............. 324/300, 307, 308, 310, 324/311, 312, 313, 314, 315, 318, 322; 128/653

[56] References Cited

U.S. PATENT DOCUMENTS

| 4,184,110 | 1/1980 | Hinshaw | 324/300 |
| 4,424,487 | 1/1984 | Lauffer | 324/300 |
| 4,602,213 | 7/1986 | Sugiura | 324/307 |

Primary Examiner—Michael J. Tokar

[57] ABSTRACT

The mechanisms that operate in nuclear magnetic resonance spectroscopy are applied to the art of magnetohydrodynamics in order to provide a system that can separate one or more chemical species from a mixture in that these NMR principles are employed to achieve a stronger magnetomotive force acting upon some components of a mixture than on other components when all of the components of a mixture are situated in a magnetohydrodynamic condition in which physical force being applied to move the components results from an high frequency magnetic field extending through the mixture in a direction perpendicular to a synchronous high frequency alternating electric field also extending through the mixture, the stronger magnetomotive force acting selectively on some components being the result of an induced resonance in those components which enables those components to absorb energy from the high frequency alternating magnetic field and to thereby interact more energetically with the perpendicular electric field for a greater magnetomotive impulse. Those components that have received the greater magnetomotive impulse by virtue of induced nuclear magnetic resonance at the frequency at which they resonate are impelled to move through solution at a greater rate than others not resonating at that frequency and are separated by their relative positions in solution after a period of migration.

7 Claims, 4 Drawing Sheets

NUCLEAR MAGNETIC RESONANCE SEPARATION

This invention uses electromagnetic interactions to separate some chemical species from mixtures of chemical compounds. The invention resembles magnetohydrodynamic systems in that magnetomotive forces are employed but differs from traditional MHD in that chemical species are moved through a solution in this present invention rather than having the solution itself be moved by electromagnetic interactions. Again, this invention resembles MHD systems in that it employs a magnetic field perpendicular to an electric current to achieve a physical motion that is perpendicular to both the the magnetic field and the current flow direction, but in the case of the present invention the liquid in which the chemical species to be separated are located is restricted from moving in order that chemical species within the liquid might move at various velocities and be separated from one another on the basis of their relative positions after a period of migration.

In order to best understand this invention in the light of prior art, it is necessary to relate it further to a particular branch of magnetohydrodynamics. There is a special area of MHD in which the magnetic field and the electric current are both alternating synchronously at a high frequency. In this art the fluid that conducts the a.c. current may be electrically conductive to direct current as well as electrically conductive to alternating current or it may be a dielectric fluid which can pass only alternating current. In that instance in which the fluid is a dielectric material, it nevertheless has properties which respond to an alternating electric field in that it reacts the way that any dielectric material of an electric capacitor reacts to an alternating current placed across its plates. That is to say the dielectric responds in such a way as to transfer alternating current from one plate to the other through the dielectric material between the plates. The current transferred through the dielectric is in proportion to the dielectric constant of the dielectric material. The dielectric material interacts with the alternating electric field. This interaction may be by way of a repeating swing of electric dipoles in the fluid as the electric dipoles repeatedly realign with the changing polarity of the alternating electric field. On the other hand this interaction may be by means of electron polarization in other dielectric fluids. In this interaction the electron orbitals around atoms and through molecules are distorted first in one direction and then in another as the electric field across the capacitor plates repeatedly changes direction. The basic principle is the same, whether the fluid is interacting with the alternating electric field by means of the electric conductivity of the fluid in the case of a conductive solution, or whether the fluid and its contents is interacting with the alternating electric field by means of dielectric mechanisms. In each case when an alternating magnetic field and a perpendicular electric field synchronized to the magnetic field act upon electrically responsive material, then that material experiences a physical force tending to move it at an angle that is prependicular to both the magnetic and electric fields. When this principle is applied to the present invention it is necessary to understand that in the invention the fluid itself is restrained from motion but that electrically responsive chemical species within the fluid are acted upon by those same perpendicular fields and are caused to move through the fluid.

Up to this point the prior art explains electromagnetically induced movement of electrically responsive chemical species located in fields but it it does not yet explain motion that can be selectively induced in one chemical species in preference to another. In this invention one species is made more responsive than others in a mixture in order that the species to be separated from the mixture might experience a greater force acting upon it to drive it from the mixture.

It is for the sake of an augmented interaction of a particular chemical species with the alternating magnetic field that this invention employs certain mechanisms from the art of nuclear magnetic resonance spectrometry. An augmented interaction between any chemical particle and the fields in which it is located means that the particular particle will experience a stronger physical force tending to move it than will other types of particles in the mixture between the fields. The additional force acting on the particles to be separated causes them to move more rapidly than other particles and to thereby be separated from them.

This invention therefore resembles nuclear magnetic resonance spectrometry in that it employs the mechanisms of NMR to impart energy from an alternating magnetic field into a selected type of chemical species in a mixture of many types of species. According to NMR phenomena those chemical species whose precessional frequency resonates with a high frequency magnetic field absorb energy from that alternating magnetic field and interact with the field to a much greater extent than those species which do not resonate at the frequency of the applied magnetic field. The alternating magnetic field of the invention then is a field with a controllable frequency that can be synchronized to the precessional frequency of atomic charges as they rotate about an axis of precession. The particular species to be separated from a mixture has a particular frequency of precession in a magnetic field of a specified strength and at that frequency the species to be separated absorbes energy from the controlled frequency alternating magnetic field. This magnetic energy absorbtion causes the species which is to be separated to interact more strenuously with the electric field that is applied according to the inventive concept. The augmented interaction due to selective resonance of particular species causes that species alone to receive a greater physical impulse to move it away from the species not resonating with the applied alternating magnetic field.

To achieve a condition of synchronized precessional rotation among nuclear charges of a particular type of chemical species this present invention must employ a strong, unidirectional magnetic field along with the adjustable frequency alternating magnetic field, and these two magnetic fields must be perpendicular to each other. In this respect the invention closely resembles NMR art and is dissimilar to MHD art. However, the invention requires the electric current flow perpendicular to the alternating magnetic field and in this respect the invention resembles MHD and differs from NMR.

In some sense this invention resembles electrophoresis, because chemical species are caused to migrate through a solution under the influence of an electric field. However, in electrophoresis it is only ions or zwitterions that move through an electrolytic solution. The charged particles move toward electrodes of opposite charge. Electrophoresis does not employ a perpendicular magnetic field and the separation process depends upon their being relative rates of migration of ions either through a solution or through a gel or paper. The different migration velocities in turn depend upon the electric charge intensity and on the hydrostatic drag of the particle as it is forced through the solution. On the contrary in the present invention high frequency alternating current is employed together with a synchronized magnetic field and the migration of chemical species through a medium is not limited to the migration of ions but to every species that has its own nuclear magnetic resonance frequency.

In a previous invention called, "Electromagnetophoresis Separation" and submitted in a disclosure document, the separation of dielectric materials is based on differences in dielectric constant among the components of a mixture. The disclosure document is Ser. No. 166,135 and it describes separation of particles in a high frequency alternating magnetic field which are acted upon by magnetohydrodynamic force, the intensity of which varies from one type of particle to another depending on the individual particle's ability to carry electric current when placed in an alternating electric field. The electric field is synchronized to the magnetic field and perpendicular to it, and the particles of chemical species that have a higher dielectric constant are acted upon with a greater electromagnetic force than those which have a lower permittivity thereby producing different velocities in the different types to separate them. Both Electromagnetophoresis Separation and the separation of the present invention employ MHD forces but the previous system is based upon a variety of current carrying capabilities among the particles to be separated whereas the present invention relies on frequency differences at which the particles to be separated resonate.

Since this invention does include magnetic interactions, it should be made clear that it is not a simple magnetic separator in which particles that can be magnetized in a magnetic field are pulled away from nonmagnetic materials simply by the attraction of the magnetic field. In the prior art particles of different chemical species are separated one from the other according to their differences in magnetic permeability. Those particles with the greater permeability experience a greater magnetic force when placed in a magnetic field and this force moves them to positions that are different for particles that have different permeabilities, but in the present invention it is not the magnetic permeability of the material nor the permeability difference between particles that is the basis for their separation but rather the particular frequency of the magnetic resonance that determines which particles in a mixture will experience a force when placed in a transverse electric field.

The magnetic interaction that takes place in this present invention is that which takes place in nuclear magnetic resonance when precession is induced magnetically in spinning atomic charges. The spinning atomic charges are atomic magnets. When a magnetic field is applied to compounds having these spinning charges, then the small atomic magnets that are due to the spinning charges tend to align with the applied magnetic field. The alignment that is actually achieved, however, is very imperfect. The final result of the applied unidirectional magnetic field is that the spinning electric charges, which create the atomic magnets, now rotate about two axes. They rotate about their own axis, the way a spinning top does, and they rotate about an axis of precession, the way a spinning top does when it begins to wobble. It is the frequency of rotation about this second axis that is of particular interest to NMR phenomena because the rate at which the charges precess as they rotate is influenced by the total electron environment in the area. The frequency of this precessional rotation is an index of the type of electron chemical bonding that is occurring between the atoms in the compounds that are placed in the unidirectional magnetic field. In NMR instruments chemical bonds are identified by the particular frequency of precession that is being detected by the instrument.

However, the NMR mechanism that is of salient importance to the present invention is the ability of the spinning atomic charges to interact with an applied alternating magnetic field that resonates with the charges on the frequency at which they are precessing. The rotating atomic magnets produce an oscillating magnetic field which is able to absorb energy from an applied magnetic field alternating at the same frequency. The greater the energy and the stronger the alternating magnetic field that can be placed across the chemical species associated with particular chemical bonds, the greater is the physical force that can be exerted against a particular chemical species to move it when it is located in an alternating electric field perpendicular to the magnetic field. It is because of the mechanism of magnetic energy absorbtion found in NMR that the present invention employs NMR methods of frequency resonance between the applied alternating magnetic field and the oscillating atomic magnets. By selectively energizing the oscillating magnetic fields of one type of compound in a mixture of many types, the one with the stronger, energized field is separated out by receiving a greater physical impulse. Although NMR science does not provide the means of imparting physical motion to selected compounds, nevertheless it does provide the means of energizing the selected compounds with very selective magnetic field absorbtion. Other art employed in the invention will then make use of the intensified magnetic field operating in the resonating compounds in order to selectively move those compounds from a mixture. This occurs in the invention by the additional employment of a synchronized electric field perpendicular to the applied alternating magnetic field.

Because special mechanism of NMR science are employed in this invention, corresponding components which cause those mechanisms to function are also employed. One such component of the invention which is common to NMR but not found in high frequency MHD is a strong unidirectional magnet. The field from this magnet is perpendicular to the alternating magnetic field. The unidirectional magnet exerts magnetic force on the atomic magnets of the compounds to be separated thereby tending to align them in its unidirectional field, but instead of a true alignment taking place a magnetic oscillation is generated. The oscillation is caused by the atomic charges rotating about two axes. The rotation about the axis of precession is the source of the magnetic oscillation which absorbs energy from the applied alternating magnetic field when the applied alternating field is resonant with the atomic oscillation frequency.

One embodiment of the basic inventive concept combines nuclear resonance and electrodynamic principles in such a way as to use atomic magnetic oscillations to produce selective force on particular species in a mixture without using an externally applied alternating magnetic field. This embodiment uses only the alternating magnetic field generated at the atomic level by electric charges that are spinning and precessing there, and the embodiment does not depend upon the absorbtion of additional energy from an applied alternating magnetic field. This embodiment can be understood by remembering that in order to physically move electric conductors, it is only necessary to have a current flowing in the conductor while the conductor is situated in a magnetic field perpendicular to the current flow. For this purpose alternating magnetic fields serve as well as unidirectional fields provided that an alternating current is employed when an alternating magnetic field is used and, of course, it is necessary that the alternating magnetic field and the alternating current be on the same frequency. This embodiment does not attempt to use a unidirectional magnetic field in conjunction with an alternating electric field to product particle motion in one direction, but rather is uses the unidirectional magnetic field to produce an alternating magnetic field and then it uses that alternating magnetic field in conjunction with a synchronized electric field to produce particle motion. In this embodiment the movement of a selected kind of particle is effected by using the alternating magnetic field generated as a result of precessional rotational forces produced when a strong unidirectional magnetic field is applied to a mixture of compounds. Since each type of chemical bond produces a unique electron environment of charge rotation, magnetic oscillations occur at different frequencies. Each frequency generated in a mixture of compounds relates to a different type of bond. Consequently, by using the alternating magnetic field of a particular frequency and associating this field with an electric current on the same frequency but in a perpendicular plane, this invention is able to move just those compounds associated with a a particular bond. By control and adjustment of the frequency of the alternating current it is possible to resonate the current with either one or another other of the frequencies of the oscillating atomic magnets of the compounds in the mixture. The compound having a magnetic resonance at the selected frequency is the compound which will experience a physical force tending to move it, and the motion that results moves the resonating compound away from the others to effect a chemical separation. Since the alternating magnetic fields are present in mixtures of compounds when a unidirectional magnetic field is applied and since each frequency of magnetic alternation is associated with a specific type of chemical bond, then all that is required to move the species with that specific bond is to be able to place the the alternating magnetic field being generated in the species in a perpendicular plane to the plane of the synchronized alternating current. This embodiment locates the plane of the alternating magnetic fields by its placement of the strong unidirectional magnetic field through the mixture. This causes the alternating magnetic field to be located in a plane perpendicular to the imposed unidirectional field. The physical force to physically separate the components of the mixture is then generated by applying electric current at the appropriate frequency to the mixture parallel to the unidirectional, applied field or in a plane that is perpendicular to both the unidirectional field and to the alternating magnetic field.

Further clarification of these and other embodiments may be had now by referring to the drawings.

Figure 1:
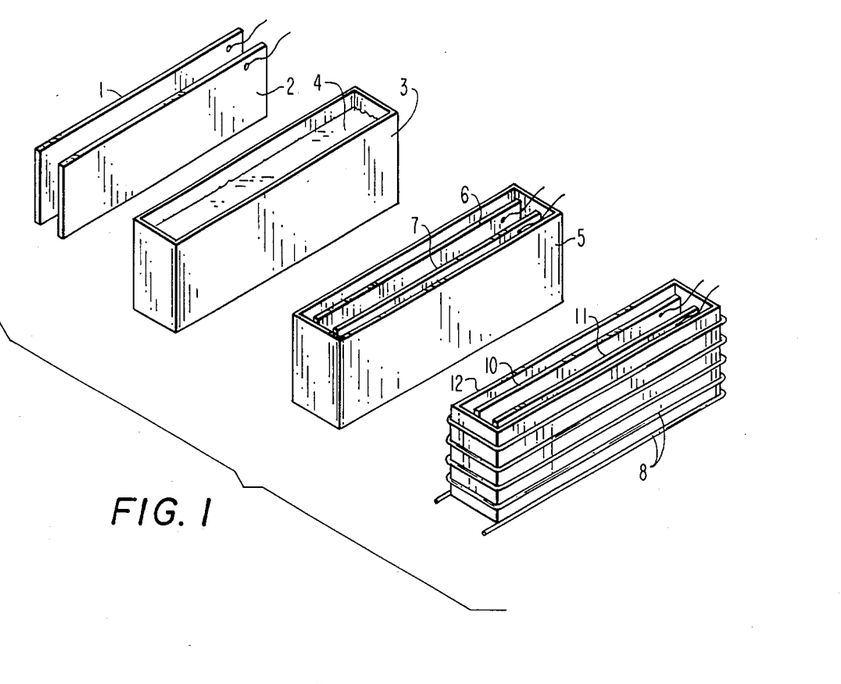
FIG. 1 of the drawings shows a bracketed group of components in the form of electrode plates, solution box, box with plates and with plates and coil.

Referring then to FIG. 1 of the drawings, electrode plates 1 and 2 are shown in a side by side position as an example of electrodes that provide a horizontal current flow from one side to the other and back repeatedly when they are placed in a liquid mixture 4 inside of solution box 3. The solution box 5 contains a mixture of compounds which are to be separated and these compounds may be supported in the solution in different ways in different embodiments. The solution 3 may be supported by a gel (not shown) and the mixture of compounds to be separated is placed in the gel in the center of 5 and between electrode plates 6 and 7. Box 5 is the same as 3 and electrodes 6 and 7 correspond to electrodes 1 and 2 but electrodes 6 and 7 are shown inside the solution box 5. There is a solution in box 5 but it is not shown in 5 since the solution is shown in box 3 which corresponds to box 5. The components of the mixture in the gel in the center of 5 that are to be separated from the other components of the mixture are driven by magnetohydrodynamic forces in an outward direction along the lengths of 6 and 7. The magnetohydrodynamic forces are described in subsequent drawings in which box 5 is shown positioned between magnetic pole pieces but the pole pieces are not shown here. In one embodiment the solution 3 merely contains a liquid mixture of components to be separated and magnetohydrodynamic forces drive a selected component from the mixture outward along the length of the pole pieces 6 and 7. The selected component may then be harvested from the solution by virtue of its increased concentration near the ends of 6 and 7 or it may be retrieved from solution by a syphon (not shown) extending into the solution to an experimentally determined depth. Since the solution will have areas of local concentrations of the selected component as a result of the preferential movement of the selected component in one direction, those concentrations cause density gradients in the solution. These gradients result in the well known electrodecantation phenomena by which horizontal gradient strata are formed. The horizontal density gradient strata have a stratum with the selected component densely concentrated by the electrodynamic action which brought it together by moving it in one direction. In this embodiment a syphon tube is inserted into the stratum of concentration and the selected component is drawn off. In this same FIG. 1 magnet coil 8 is shown encircling solution box 12 to produce a high frequency alternating magnetic field through 12. This field is shown as a vertical field and must always be perpendicular to the flow of synchronized a.c electric current flowing across electrodes 10 and 11. Solution box 12 corresponds to box 3 and electrodes 10 and 11 correspond to electrodes 1 and 2, but 10 and 11 are shown inside box 12 whereas 1 and 2 are shown for the sake of a clear view of the electrodes. Box 12 contains a solution such as 4 in box 3, but the liquid is not shown in 12 in order to more clearly show the electrodes 10 and 11. When box 12 is placed in an unidirectional magnetic field shown later in FIG. 3 then mixtures in 12 such as the mixtures to be separated in box 5 are acted upon by both the high frequency alternating magnetic field extending through the mixture in a vertical direction and by the synchronous electric field extending through the mixture horizontally from side to side. Those components of the mixture with a nuclear magnetic resonance in the unidirectional magnetic field to the frequency of the alternating magnetic field of coil 8 experience a transverse physical force which selectively moves them along the length of electrodes 10 and 11 in one direction until they reach the end of 12 where they are concentrated by their movement to that position. They can be removed as they are removed from box 5 by the use of a gel in which they are concentrated or by a syphon after they have decanted into a horizontal stratum. The gel and the syphon are not shown, but their use is well understood by those skilled in electropnoresis art.

Figure 2:
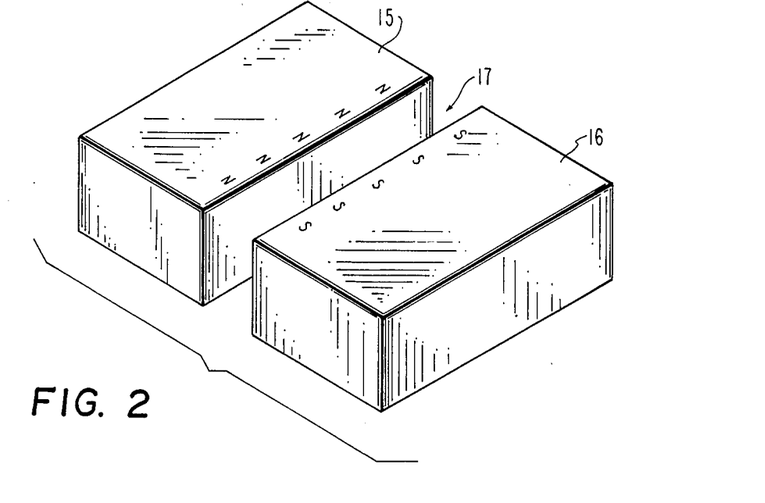
FIG. 2 shows magnetic pole pieces with a gap between the poles.

In FIG. 2 the magnetic pole pieces 15 and 16 produce an intense unidirectional magnetic field. The strength of the field can be from a few hundred to ten thousand gauss across gap 17 and the strength of this field is critical in determining the frequency at which a nuclear atomic charge will resonate with an externally applied alternating magnetic field when the species with a net nuclear charge is placed in gap 17. The frequency at which any kind of particle with a nuclear charge other than zero resonates in gap 17 is called the Larmor frequency and it is determined in practice by finding the product of the field strength across 17 and the gyromagnetic ratio of the nuclei in the magnetic field. The gyromagnetic ratio is a unique property that is different for each element and isotope. Its numerical value is also different for the frequency of spinning charges associated with a wide variety of different chemical bonds. By determining the gyromagnetic ratio from NMR literature on a particular element or chemical bond and then by measuring and stabilizing the field strength across 17, it is possible to determine the exact frequency at which the particular element or chemical bond will resonate when a perpendicular alternating magnetic field is placed across the unidirectional field and through the element. The resonating frequency is found by multiplying the gryomagnetic ratio by the field strength in gauss. Pole pieces 15 and 16 may be of a permanent magnet in one embodiment or of an electromagnet in another or even of a cryogenitic magnet in a third. The coil windings of an electromagnet are not shown nor is the apparatus for a cryogenic magnet as these are well understood in magnetic art. The magnets of which 15 and 16 are the poles are not shown.

Figure 3:
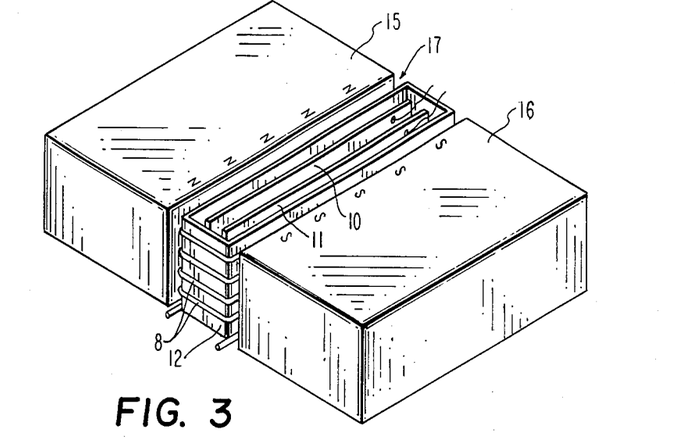
FIG. 3 shows pole pieces with solution box and solution box coil located between the magnetic pole pieces.

In FIG. 3 the magnet coil 8 provides a strong, alternating magnetic field in gap 17. The field from 8 is in a vertical direction. Those compounds in box 12 which resonate with the frequency of 8 absorb energy from the alternating magnetic field and interact more energetically with the synchronized, alternating electric field across electrodes 10 and 11. This interaction between the alternating, perpendicular magnetic and electric fields energetically forces the frequency-selected, resonant species along the length of 12 and after a period of migration, the selected particles are separated from the other particles of the mixture by virtue of being in different positions along the length of electrodes 10 and 11. The magnetic pole pieces in this FIG. 3 are the same as in FIG. 2 and the box 12 and electrodes 10 and 11 are the same as in FIG. 1 except that in this FIG. 3 box 12 with coil 8 is shown inserted in gap 17 whereas in FIG. 2 gap 17 is shown in an empty condition.

Figure 4:
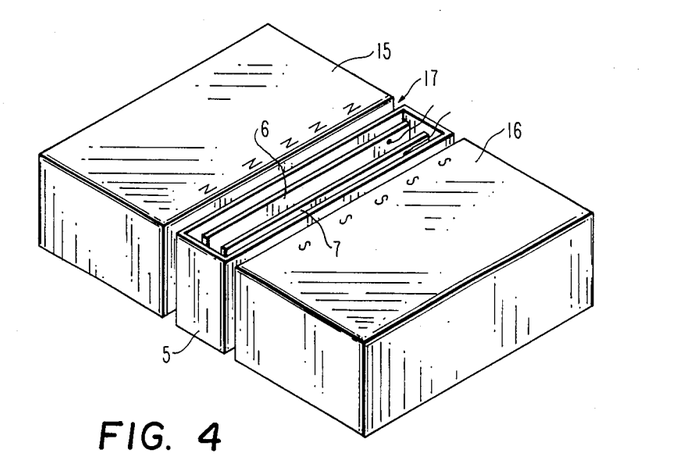
FIG. 4 shows magnetic pole pieces with a solution box between the pole pieces but without a magnet coil around the solution box.

In the FIG. 4 box 5 with its electrodes 6 and 7 is shown between magnetic pole pieces 15 and 16. The solution with a mixture of compounds to be separated is not shown here but is the same as 3 in FIG. 1. Electrodes 6 and 7 are the same as in FIG. 1 and pole pieces 15 and 16 are the same in this FIG. 4 as in FIG. 2. Box 5 of FIG. 1 is here shown in the gap 17 of FIG. 2. The unidirectional magnetic field across 15 and 16 causes certain of the compounds in 5 to oscillate in plane that is perpendicular to the field between 15 and 16. In this case the vertical plane is used. Some of the particles, that are caused to oscillate by the magnetic unidirectional field, resonate with the alternating electric field between 6 and 7. Since these resonating particles have synchronous magnetic and electric fields acting upon them, and because these two fields are at right angles, the particles are forced to move in a plane perpendicular to both the alternating magnetic field and to the alternating electric current. This force causes the frequency-selected group of particles to move along the lengthwise direction of box 5 and to be concentrated at one end of box 5 for removal or they can be removed by other means described herein for removal of particles moving along the length of the electrodes such as along the length of electrodes 10 and 11 in FIG. 3.

Figure 5:
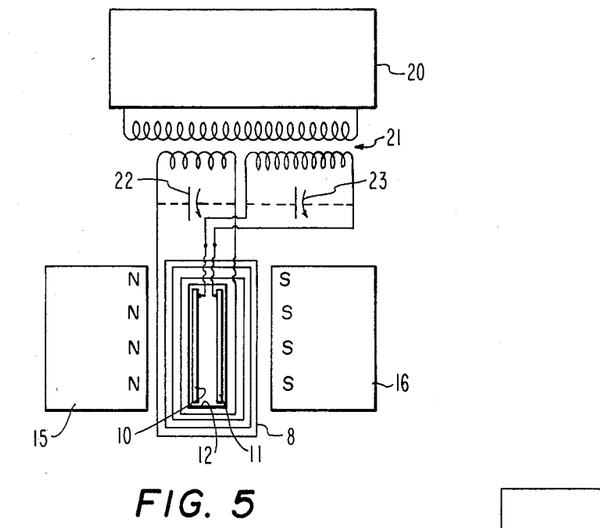
FIG. 5 shows a schematic diagram of electrodes in a box surrounded by a coil which is between magnetic pole pieces, also a balun coil connected to a radio frequency power generator.

Referring now to FIG. 5 which is the schematic diagram of the elements shown in FIG. 3 with the additional connections to a radio frequency power source 20. The radio frequency power source 20 provides radio frequency power at any selected frequency within a spectrum of frequencies from one megahertz to thirty megahertz approximately. Power source 20 is a variable frequency generator with calibrations to determine the frequency output. The power output of 20 is different in different embodiments depending upon the size of the other components and upon the volume of the chemical species to be separated, but can range from ten watts for a small instrumental separator to many hundreds of watts in those embodiments in which separation is being done on a production scale. The balun coil 21 matches the impedance of the output of 20 to the impedance across the electrodes 10 and 11 and it matches the impedance of 20 to that of vertical alternating magnetic field coil 8. Because 20 is the same source of power for the electric field across 10 and 11 as well as for coil 8, the current flow across 10 and 11 is synchronized to the magnetic alternating field of 8. The small variable capacitors 22 and 23 ballance the electric phase relationships between 8 on one hand and 10 and 11 on the other hand. These phase balancing capacitors are optional in some embodiments in which such balancing is accomplished by variable coupling in balun coil 21. The pole pieces 15 and 16 are the same as the unidirectional magnetic field pole pieces described in FIG. 2 and FIG. 3. Box 12 is the same as box 12 of FIG. 3.

Figure 6:
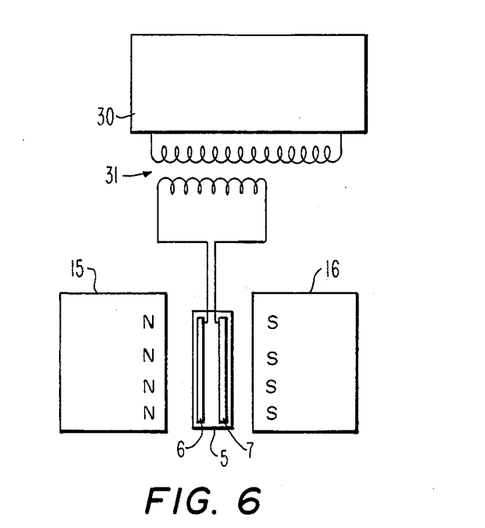
FIG. 6 shows a schematic diagram of electrodes in a box which is in a gap between magnetic pole pieces with the electrodes being connected to a balun coil that is connected to a radio frequency generator.

In FIG. 6 which is a schematic diagram of the components whose function is described in FIG. 4, the radio frequency power source 30 corresponds to 20 of FIG. 5 and functions in the same way as it does in FIG. 5 except that in the embodiment of this FIG. 6 power supply 30 drives only electrodes 6 and 7 and does not drive a vertical magnetic field coil such as coil 8 in FIG. 5. The balun coil 31 in this FIG. 6 matches the impedance of 30 to electrode impedance between 6 and 7. The pole pieces 15 and 16 are the same as 15 and 16 in FIG. 4 as is box 5.

Figure 7:
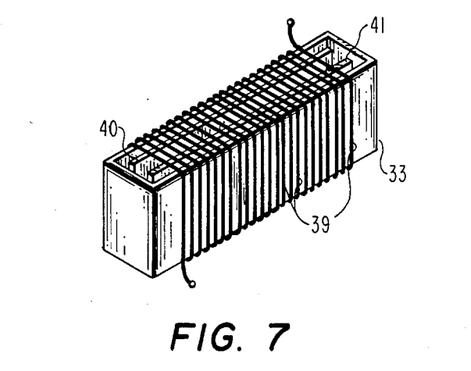
FIG. 7 shows a box with electrodes and a coil encircling the box.

In FIG. 7 the box 33 corresponds to box 12 of FIG. 3 and box 5 of FIG. 4. Electrodes 40 and 41 of this FIG. 7 correspond to electrodes 10 and 11 of FIG. 3 and 6 and 7 of FIG. 4. In this FIG. 7 the coil 39 provides an alternating magnetic field which is used in conjunction with the synchronized, alternating electric current across 40 and 41 to drive resonating particles along the length of 40 and 41. However, as coil 39 is shown in this FIG. 7, it provides only an horizontal alternating magnetic field that extends in a direction along the length of 40 and 41, but when 39 is placed in an horizontal, unidirectional magnetic field perpendicular to the alternating magnetic field of 39, then a second alternating magnetic field is induced in particles capable of resonating on the frequency of the magnetic oscillations of coil 39. This second magnetic field resulting from from resonance has a vertical component. This component is in the same direction as that of coil 8 in FIG. 3 ever though, in the case of this FIG. 7, the vertical magnetic field is induced indirectly by a coil 39 which produces an horizontal field and is perpendicular to coil 8 of FIG. 3.

Figures 8, 9, 10:
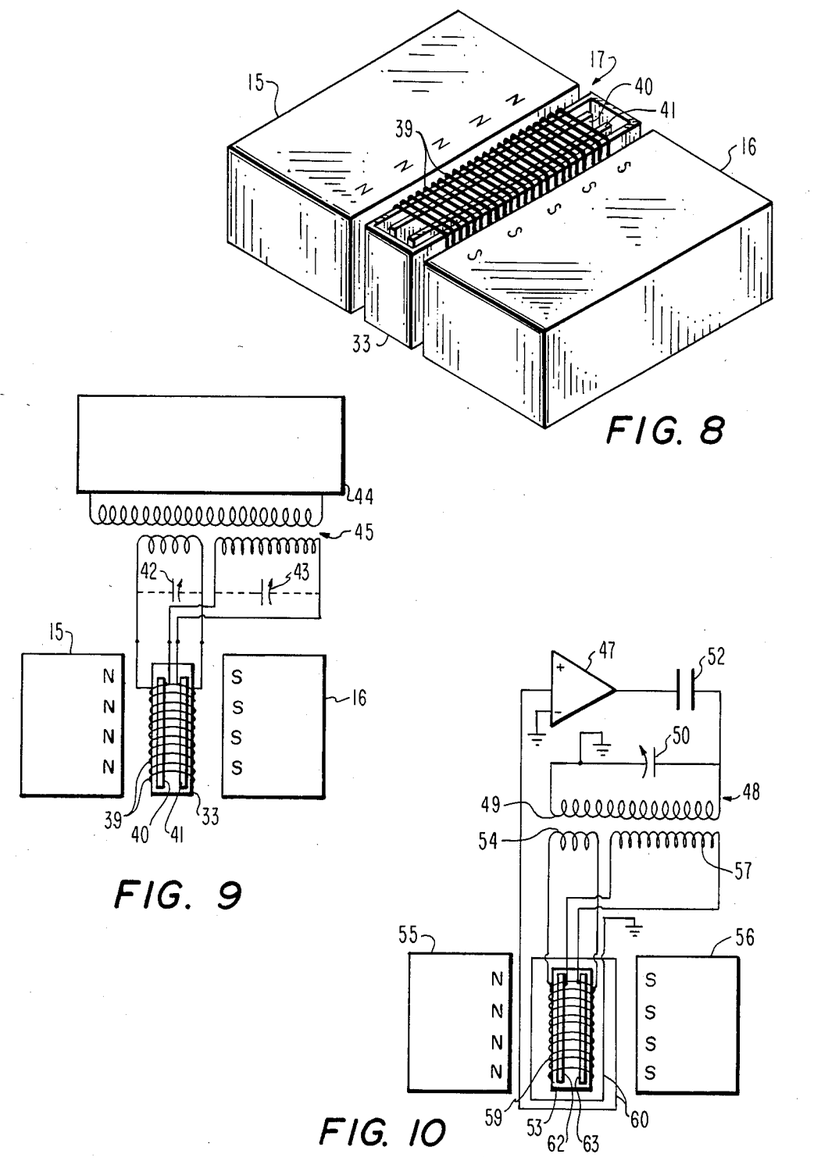
FIG. 8 shows a box with electrodes and a coil in a gap between magnetic pole pieces.
FIG. 9 is a schematic diagram of electrodes in a box encircled by a coil between magnetic pole pieces and a radio frequency transformer with its power supply.
FIG. 10 is a schematic diagram of a radio frequency power oscillator coupled to a radio frequency output transformer which is connected to a coil encircling a box between magnetic pole pieces.

In FIG. 8 the box 33 with its coil 39 and electrodes 40 and 41 of FIG. 7 are shown in their operating position between magnetic pole pieces 15 and 16 in gap 17. The pole pieces are identical to those of FIG. 3 as is gap 17. In this FIG. 7 the coil 39 performs the same function as coil 8 in FIG. 3 in spite of the fact that they are wound in different directions. Electric current flowing through 39 creates a strong alternating magnetic field perpendicular to the unidirectional magnetic field across gap 17. The absorbtion of energy from this field by resonating species in box 33 provides a strong alternating magnetic field that is perpendicular both to the unidirectional field across 17 and to the field of 39. The direction of this field due to resonating species is in accord with the dynamics of precessional rotation which takes place when atomic charges rotate about two axes under the influence of a strong unidirectional magnetic field. According to the embodiment shown in this FIG. 8, the alternating magnetic field employed to effect particle motion and separation is the field developed by resonances within the chemical species and perpendicular to an externally imposed alternating magnetic field. This field which is not only perpendicular to the applied alternating magnetic field but also perpendicular to the unidirectional magnetic field is well known in NMR spectroscopy as it is the field that is sensed in order to detect nuclear resonances and to identify the resonating species. This same field in the present invention is interacted with an applied, perpendicular electric field through the particles in order to move and separate those particles that are oscillating in resonance with both the electric and the magnetic fields. In this FIG. 8 the resonance-originated, alternating magnetic field has a vertical direction and therefore when interacted with the a.c. current flow between 40 and 41 it will move the particles to be separated along the length of box 33.

In FIG. 9 power supply 44 is the same as power supply 20 of FIG. 5 in that it is capable of providing radio frequency energy across a broad spectrum of frequencies and is capable of being controlled to maintain a stable, single frequency on any frequency selected. In this FIG. 9 the balun coil 45 corresponds to 21 of FIG. 5 and is employed to match the impedances of the electric current between electrodes 40 and 41 to the impedance of the output of 44. Balun 45 also matches the impedance of alternating magnetic field coil 39 to that of 44. Chemical species to be separated are placed in solution box 33 which is between pole pieces 15 and 16. Since the source of radio frequency energy is the same in frequency to 39 and to current between 40 and 41 resonating particles are caused to migrate along the length of 33. The magnetic pole pieces 40 and 41 as well as box 33, coil 39 and electrodes 40 and 41 are the same as the elements with those numbers in FIG. 8, but this FIG. 9 is a schematic diagram showing the appropriate electrical connections between the elements. Variable capacitors 42 and 43 function in the same way as capacitors 22 and 23 of FIG. 5.

In FIG. 10 the power oscillator 47 provides a broad spectrum of radio frequency energy as did the radio frequency power supply 44 of FIG. 9, but in this FIG. 10 the power oscillator 47 has its frequency controlled in part by the frequency of resonance of the particles being separated and in part by the resonance frequency of the output tank circuit 48 consisting of tank coil 49 and tuning capacitor 50. The tank circuit 48 has a high Q so that it will resonate only within a narrow range of frequencies as determined by the tuning of capacitor and the inductive value of coil 49. The excitation energy required to drive 47 is provided principally by electromagnetic induction from frequency selected resonating species in box 53 rather than by electromagnetic induction directly from one coil to another as from coil 59 to coil 60. Electromagnetic induction from 59 into 60 is kept to a minimum by the placement of their fields at approximately right angles to each other so that any energy transfer between these two coils must be by way of resonating particles which absorb energy from a field in one direction and then provide an alternating magnetic field perpendicular to the field in which it was absorbed. Since only particles resonating at the selected frequency of 48 can provide radio frequency energy in the direction necessary to induce current into coil 60, feedback energy necessary to drive oscillator 47 to full power output is limited to the resonant frequency of those particles which can oscillate synchronously with the frequency of tank circuit 48. To separate an individual species, tank 48 is tuned to the Larmor frequency of that species. Then, since the species to be separated is the only one which will be resonating, it is the only species that can transfer excitation energy into the input of power oscillator 47 and provide the feedback loop necessary to sustain strong oscillation. This causes power oscillator to lock-on to the Larmor frequency of the species being separated. Since the Larmor frequency is dependent upon the field strength of the magnetic field between magnetic pole pieces 55 and 56 and fluctuation in the strength of the magnetic field will cause a change in its cycles per second the frequency of the oscillator 47 will change with the Larmor frequency of the particles and the particles will be caused to resonate at the new rate just as the altered frequency has again become the Larmor frequency for those same particles. The alternating magnetic field energy absorbed by resonating particles in box 53 from coil 59 is provided from winding 54 inductively coupled to tank inductor 49, and the synchronized, alternating electric field between electrodes 62 and 63 is provided by coil 57 inductively coupled to tank coil 49. According to the primary embodiment of the basic inventive concept being described in this FIG. 10, the interelectrode capacitances of 47 are balanced to prevent self oscillation so that all feedback energy must pass through resonating particles in box 53 in order that the resonant frequency of selected particles might determine the frequency of the power oscillator 47. However, in a secondary embodiment a very small amount of interelectrode imbalance is induced or other feedback path is provided sufficient to establish a very weak oscillation in 47 and through 53. This initial feedback energy is used to excite particles of low reaction responce into resonance oscillation. Then, once they are oscillating, they become the means of greater energy feedback from 59 to 60 in order to drive 47 to the power level necessary to move the resonating particles along the length of box 53. Feedback paths and means are not shown as they are well understood in radio frequency art except for the path that is shown across 59 and 60. Coupling capacitor 52 transfers radio frequency energy from 47 to tank 48.

Throughout the drawings reference is made to the separation of selected species being made on the basis of the relative rates of motion of species particles along the lengths of the electrodes such as electrodes 10 and 11 of FIG. 3 or electrodes 6 and 7 of FIG. 4. The precise direction of motion was not described previously in order to avoid confusion in a multiplicity of details. However, it should now be noted that the direction follows the left hand rule of force, field and current. It is possible to determine the direction of the force when the direction of the magnetic field and the direction of the electric current are known. In the case of the high frequency alternating current employed in this invention, the magnetic field alternations are synchronized to those of the electric current and consequently there is a period during each alternation in which the current direction can be compared with the field direction. If at that time conventional current is flowing to the right as from electrode 10 to electrode 11 and the magnetic field is flowing upward through coil 8 and the particles then the force on the particles will be in a backward direction, away from the reader. The thrust force will still be in that same direction during the next half cycle because both the magnetic field direction and the current direction will have changed. In that second half cycle the magnetic field will be downward and the current flow will be to the left from 11 to 10 again producing a force vector that is toward the back of the page and away from the reader. However, if the polarity of the current is changed with respect to the direction of the magnetic field during the period of any half cycle of alternation, then the force vector will reverse and particles will be driven in the opposite direction. For instance, when the magnetic field is downward during half a cycle and at the same time the direction of conventional current flow is from left to right then the physical force acting upon the selected particle is toward the reader. When the direction of migration of particles is to be changed, the change is effected by reversing the connections to either coil 8 or to electrodes 10 and 11 but not to both coil and electrodes.

Since the physical thrust forces that can be achieved to act upon frequency-selected resonating particles are quite weak for some species when working with unidirectional magnetic fields of ordinary flux density, some embodiments of the invention employ super conducting magnets of tens of thousands of gauss. For instance the pole pieces 15 and 16 of FIG. 3 are those used in cryogenic art and gap 17 of FIG. 3 has a magnetic flux density of twenty thousand gauss.

Finally, it is clear that the strength of the unidirectional magnetic field is a factor in determining the Larmor frequency of any resonating chemical species The Larmor frequency is the product of the gyromagnetic ratio and the magnetic field strength in gauss. Control of the magnetic field strength provides a control over the resonating frequency of any individual species in embodiments of the basic concept in which the Larmor frequency is adjusted to match that of the power supply by adjustment of the strength of the unidirectional magnetic field. In one such embodiment the strength of the unidirectional magnetic field of an electromagnetic is controlled by a reostat in series with the magnet and its current source. In another embodiment an electronic current control precisely limits and regulates current to an electromagnet in order to control its field strength and place it at a value that will cause selected species to resonate in an alternating magnetic field of predetermined frequency.

I claim:

1. A chemical separation comprising:
 a radio frequency power supply capable of providing radio frequency electric current on any one of a wide range of frequencies from approximately 1 KHZ to 100 KHZ and
 a radio frequency power transformer capable of a broard spectrum of frequencies having a plurality of windings and connections for transferring radio frequency power at the proper impedance to electrodes in a solution and to a radio frequency coil for exciting chemical species to nuclear magnetic resonance, and
 means for producing both magnetic resonance selectively in specific species in a mixture containing a plurality of chemical species and an alternating magnetic field due to that resonance in specific species comprising a magnet having a unidirectional magnetic field in a gap between its pole pieces with a box of said mixture in solution in the gap, and a radio frequency coil capable of generating an imposed alternating magnetic field through said box and perpendicular to the unidirectional field in the box, said coil encircling the box with the mixture and being powered by said power supply with sufficient radio frequency energy on the Larmor frequency of the species to be separated as to be capable of exciting these selected species into resonant oscillation with the coil and
 means to act upon the resonating species in order to move the resonating species relative to other species in the mixture comprising electrodes capable of conducting electric current, synchronized to the frequency of the alternating magnetic field, through the mixture in a plane perpendicular to an alternating magnetic field of the resonating chemical species and of thereby exerting electromechanical, physical thrust against the resonating species to move it through the box and away from non-resonating species of the mixture.

2. A chemical separation system as in claim 1 in which the electric current flow between the electrodes in a plane perpendicular to an alternating magnetic field of the resonating species is perpendicular to the imposed alternating magnetic field of the radio frequency coil.

3. A chemical separation system as in claim 1 in which the electric current flow between the electrodes in a plane perpendicular to an alternating magnetic field is in the same plane as that of the imposed alternating magnetic field of the coil encircling the mixture.

4. A chemical separation system as in claim 1 in which the radio frequency power supply is a variable frequency power supply, variable across a broad spectrum of frequencies and capable of being adjusted to oscillate on any one frequency in a broad band of frequencies and of thereby being tuned to any one of a number of resonating frequencies each one of which is associated with a chemical species in a mixture of a plurality of species.

5. A chemical separation system as in claim 1 in which the radio frequency power supply is a radio frequency power oscillator having a feedback loop providing excitation which receives radio frequency energy only from an alternating magnetic field of resonating chemical species to be separated and not through any other feedback path.

6. A chemical separation system as in claim 1 in which the radio frequency power supply is a radio frequency power oscillator having a feedback loop for exciting the oscillator that transfers output energy bach to the input through the oscillations of the resonating species in part and in part through a direct path from the output to the input circuits.

7. A chemical separation system as in claim 1 in which the magnet providing the unidirectional magnetic field is an electromagnet of variable field strength in which the strength of the field is a function of the quantity of current flow through the magnet coil, said magnet thereby being capable of determining the frequency of resonance of a resonating species within its field by a control of the d.c. the magnet receives and of thereby matching the Larmor frequency of a species to be separated to a selected frequency of the radio frequency power supply.

* * * * *

UNITED STATES PATENT AND TRADEMARK OFFICE
CERTIFICATE OF CORRECTION

PATENT NO. : 4,737,711

DATED : April 12, 1988

INVENTOR(S) : Louis R. O'Hare

It is certified that error appears in the above-identified patent and that said Letters Patent is hereby corrected as shown below:

Column 12, line 41, "KHZ to 100 KHZ" should read -- MHZ to 100 MHZ --.

Signed and Sealed this

Thirteenth Day of September, 1988

Attest:

DONALD J. QUIGG

*Attesting Officer*            *Commissioner of Patents and Trademarks*